United States Patent [19]

Dorri et al.

[11] Patent Number: 5,517,168

[45] Date of Patent: May 14, 1996

[54] SUPERCONDUCTING MAGNET WITH MAGNETIC SHIELDING

[75] Inventors: Bizhan Dorri, Clifton Park; Evangelos T. Laskaris, Schenectady; Michele D. Ogle, Burnt Hills, all of N.Y.

[73] Assignee: General Electric Company, Schenectady, N.Y.

[21] Appl. No.: 323,648

[22] Filed: Oct. 17, 1994

[51] Int. Cl.[6] .................................................... G01V 3/00
[52] U.S. Cl. .......................... 335/301; 335/216; 324/318; 324/319
[58] Field of Search ........................... 335/216, 296–301; 324/318–320

[56] References Cited

U.S. PATENT DOCUMENTS

| | | |
|---|---|---|
| 4,724,412 | 2/1988 | Kalafala . |
| 4,924,198 | 5/1990 | Laskaris . |
| 5,237,300 | 8/1993 | Ige et al. . |
| 5,291,169 | 3/1994 | Ige et al. . |
| 5,309,106 | 5/1994 | Miyajima et al. ............. 324/318 |

OTHER PUBLICATIONS

"Open MRI Magnet with Superconductive Shielding", by E. T. Laskaris, U.S. Patent Application Ser. No. 08/260,433, filed Jun. 15, 1994.

See "Background of Invention" of present patent application.

Concurrently filed patent application RD-23587, "Superconducting Magnet with Magnetic Shielding", by E. T. Laskaris et al.

Primary Examiner—Leo P. Picard
Assistant Examiner—Raymond M. Barrera
Attorney, Agent, or Firm—Douglas E. Erickson; Paul R. Webb, II

[57] ABSTRACT

A superconductive magnet with magnetic shielding has an annularly-cylindrical-shaped housing whose first end wall and outer cylindrical wall are magnetizable (e.g., iron) walls and whose inner cylindrical wall is a non-magnetizable wall. At least one main superconductive coil is positioned within the housing and carries an electric current in a first (e.g., clockwise) direction. A first resistive (e.g., copper) deflection coil is positioned outside the housing radially proximate the outer cylindrical wall and longitudinally closer to the first end wall than to a midpoint located between the two end walls. The first deflection coil carries an electric current in an opposite direction to the first direction so that its magnetic field longitudinally pushes the stray magnetic field of the superconductive coil(s), which leaves the magnet's bore, inward to be captured by the iron first end wall.

4 Claims, 2 Drawing Sheets

SUPERCONDUCTING MAGNET WITH MAGNETIC SHIELDING

BACKGROUND OF THE INVENTION

The present invention relates generally to a superconductive magnet used to generate a magnetic field, and more particularly to such a magnet having magnetic shielding to protect the area around the magnet from stray magnetic fields originating from the magnet.

Superconductive magnets are used in various fields such as in MRI (magnetic resonance imaging) medical diagnostics. Known superconductive magnets are cooled by liquid helium or by a cryocooler coldhead. Conventional superconductive magnets include closed and open magnets. A closed superconductive magnet has a single superconductive coil assembly with at least one generally solenoidal-shaped main superconductive coil spaced apart from and surrounded by a generally annularly-cylindrical-shaped housing having a bore, with at least one thermal shield interposed between the main superconductive coil(s) and the housing. An open superconductive magnet has two longitudinally spaced-apart superconductive magnet assemblies with each superconductive magnet assembly similar to a closed superconductive magnet. It is noted that the open space between the two superconductive magnet assemblies of an open MRI medical magnet helps relieve the patient of any claustrophobic feelings and provides the doctor with access to the patient for surgical procedures during MRI operation.

Medical MRI superconductive magnets are magnetically shielded to prevent the high magnetic field created by and surrounding the main superconductive coil(s) from adversely interacting with electronic equipment located in the vicinity of the magnet. Known techniques for magnetically shielding superconductive magnets include active and/or passive shielding. Active shielding techniques include employing superconductive shielding coils which are cooled by liquid helium or a cryocooler coldhead and which are located within the housing. The superconductive shielding coils carry electric current of generally equal amperage and opposite direction to the electric current carried by the main superconductive coil(s). The total number of ampere turns of the superconductive shielding coils is equal to or greater than generally one-third of the total number of ampere turns of the main superconductive coil(s). The superconductive shielding coils are positioned within the housing radially outward of the main superconductive coil(s) so that the magnetic field of the superconductive shielding coils opposes the magnetic field of the main superconductive coil(s) to magnetically shield the area outside the magnet. It is noted that, due to the presence of the superconductive shielding coils, the total number of ampere turns of the main superconductive coil(s) must be made much larger to achieve the desired magnetic field strength in the magnet's bore (i.e., the bore of the housing), as can be appreciated by those skilled in the art.

Passive shielding techniques include employing iron in the outer cylindrical wall of the housing to capture and contain the magnetic fields generated by the main superconductive coil(s) so that such magnetic fields stay within the housing. A closed magnet would also employ iron in the two longitudinally spaced-apart end walls of the housing, while an open magnet would also employ iron in the longitudinally outer end wall of the housing for each of the two superconductive magnet assemblies. It is noted that an open magnet would further require an iron shield for the open space between the two superconductive magnet assemblies. However, closing the open space between the two superconductive magnet assemblies of an open magnet with an iron magnetic shield would eliminate the very advantages of the open magnet design.

Known superconductive magnet installations have included unshielded superconductive magnets sited in rooms having iron or resistive shielding coils located in the room walls to magnetically shield the areas outside the room.

What is needed is a superconductive magnet with improved magnetic shielding. The magnetic shielding must not require the increase in ampere turns for the main superconductive coil(s) or the use of extreme cooling measures as required when using superconductive shielding coils, and the magnetic shielding must not require the full size and weight of iron as required when using a conventional iron housing.

SUMMARY OF THE INVENTION

It is an object of the invention to provide a superconductive magnet with improved magnetic shielding.

The superconductive magnet of the invention includes a generally longitudinally extending axis, a generally annularly-cylindrical-shaped housing, a superconductive coil assembly, and a first resistive deflection coil. The housing is generally coaxially aligned with the axis, has annular, longitudinally-spaced-apart first and second end walls, and has radially-spaced-apart outer and inner cylindrical walls. The first end wall and the outer cylindrical wall are generally magnetizable (e.g., iron) walls, and the inner cylindrical wall is a generally non-magnetizable wall. The superconductive coil assembly has at least one generally solenoidal-shaped main superconductive coil which is generally coaxially aligned with the axis, which is located within and generally spaced apart from the housing, which has a number of ampere turns, and which carries an electric current generally in a first direction. The first resistive deflection coil is generally coaxially aligned with the axis, positioned outside the housing radially proximate the outer cylindrical wall and longitudinally closer to the first end wall than to a midpoint located on the axis longitudinally halfway between the end walls, and carries an electric current generally in an opposite direction to the first direction.

Several benefits and advantages are derived from the invention. The size and weight of the generally magnetizable (e.g., iron) outer cylindrical wall and first end wall is reduced from that of a conventional iron housing due to the presence of the first resistive deflection coil. The stray magnetic field generated by the main superconductive coil(s), which is not captured by the longitudinally-shortened outer cylindrical wall and first end wall of the invention, leaves the bore of the housing. Such stray magnetic field then passes by the first end wall in a generally radially outward direction. The magnetic field of the first resistive deflection coil magnetically pushes such stray magnetic field longitudinally inward into the generally magnetizable (e.g., iron) first end wall where it is captured. It is noted that the first resistive deflection coil is not superconductive and therefore does not require extreme cooling measures. It is also noted that the first resistive deflection coil is located outside the housing proximate the generally magnetizable (e.g., iron) outer cylindrical wall. Therefore, the main superconductive coil(s) do not need to have the total number of ampere turns appreciably increased to achieve the desired magnetic field strength in the magnet's bore.

BRIEF DESCRIPTION OF THE DRAWINGS

The accompanying drawings illustrates two preferred embodiments of the present invention wherein.

DETAILED DESCRIPTION OF THE INVENTION

Figure 1:
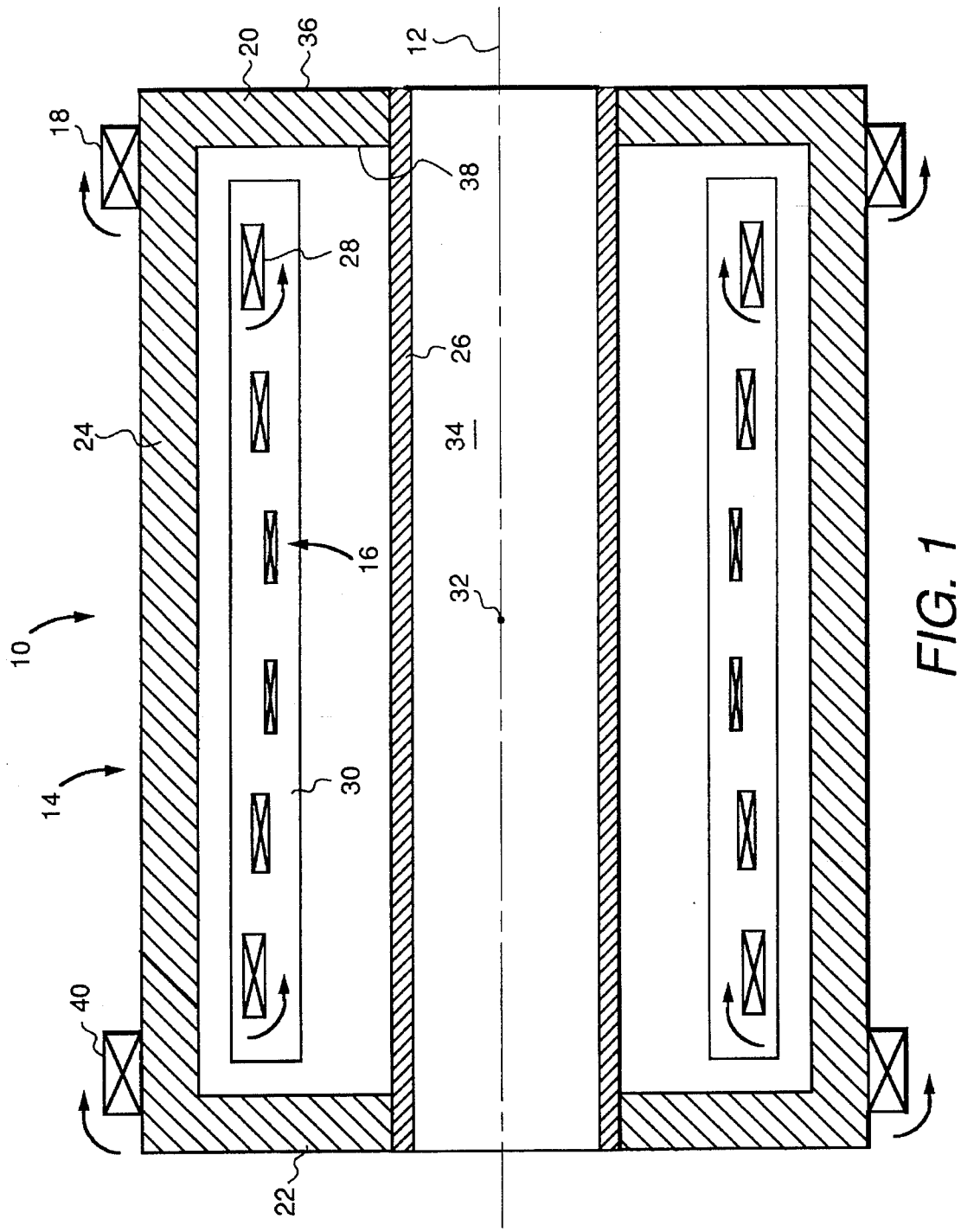
FIG. 1 is a schematic cross-sectional side-elevational view of a closed superconductive magnet of the present invention.

Referring now to the drawings, wherein unnumbered arrows indicate magnetic field direction, FIG. 1 shows a first preferred embodiment of the superconductive magnet 10 of the present invention. The magnet 10 includes a generally longitudinally extending axis 12, a generally annularly-cylindrical-shaped housing 14, a superconductive coil assembly 16, and a first resistive deflection coil 18.

The housing 14 is generally coaxially aligned with the axis 12, has annular, longitudinally-spaced-apart first and second end walls 20 and 22, and has radially-spaced-apart outer and inner cylindrical walls 24 and 26. In a preferred construction, the end walls 20 and 22 and the cylindrical walls 24 and 26 are hermetically connected together to define a vacuum enclosure. The first end wall 20 and the outer cylindrical wall 24 are generally magnetizable walls, and the inner cylindrical wall 26 is a generally non-magnetizable wall. In another preferred construction, the first end wall 20 and the outer cylindrical wall 24 are added on to a separate vacuum enclosure (not shown in the figures). It is seen from FIG. 1, that magnet 10 is a closed magnet wherein the housing 14 is a closed-magnet housing. For a magnet 10 which is a closed magnet, the second end wall 22 is a generally magnetizable wall. Preferably, a magnetizable wall is made of ferromagnetic material, although other more exotic magnetizable materials are known to those skilled in the art. In a preferred embodiment, the first and second end walls 20 and 22, and the outer cylindrical wall 24 consist essentially of iron. It is noted that the end walls 20 and 22 and the outer cylindrical wall 24 preferably are connected together, such as, for example, by being formed together as a single member or by being separately-formed as separate members which are attached together. Preferably, the non-magnetizable inner cylindrical wall 26 consists essentially of non-magnetizable stainless steel.

The superconductive coil assembly 16 has at least one generally solenoidal-shaped main superconductive coil 28. The at least one main superconductive coil 28, seen in FIG. 1, has six such coils which are referred to together, and numerically referenced together, as the at least one main superconductive coil 28. The at least one main superconductive coil 28 is generally coaxially aligned with the axis 12 and is disposed within and generally spaced apart from the housing 14. The at least one main superconductive coil 28 has a number of ampere turns and carries an electric current generally in a first direction. The first direction is defined to be either a clockwise or a counterclockwise circumferential direction about the axis 12 with any slight longitudinal component of current direction being ignored. In an exemplary embodiment, the at least one main superconductive coil 28 comprises niobium-tin superconductive tape or wire. Preferably, the at least one main superconductive coil 28 is supported by a coil form 30 which is supported by thermally insulating spacer tubes and/or tie rod straps (not shown in the figures) from the housing 14.

For a superconductive magnet cooled by a cryocooler coldhead (such as that of a conventional Gifford McMahon cryocooler), a thermal shield (omitted from the figures for clarity) would be disposed between and spaced apart from the superconductive coil assembly 16 and the housing 14 with the coldhead's first stage (having a temperature of generally 40 Kelvin) in thermal solid-conductive contact with the thermal shield and with the coldhead's second stage (having a temperature of generally 10 Kelvin) in thermal solid-conductive contact with the at least one main superconductive coil. For a superconductive magnet cooled by liquid helium, the superconductive coil assembly 16 would be placed in the liquid helium container within the housing 14 and two spaced-apart thermal shields would be disposed between and spaced apart from the liquid helium container and the housing (such liquid helium container and thermal shields omitted from the figures for clarity).

The first resistive deflection coil 18 is generally coaxially aligned with the axis 12 and is disposed outside the housing 14 radially proximate the outer cylindrical wall 24 and longitudinally closer to the first end wall 20 than to a midpoint 32 located on the axis 12 longitudinally halfway between the end walls 20 and 22. From FIG. 1, the midpoint 32 is seen to lie in the bore 34 of the housing 14 (i.e., the magnet's bore) and typically would lie at the center of an MRI imaging volume (not shown). Preferably, and as also from FIG. 1, the first resistive deflection coil 18 is positioned generally longitudinally inward of the outer annular surface 36 of the annular first end wall 20 and is connected to the outer cylindrical wall 24. It is noted that a point is defined to be generally longitudinally inward of the outer annular surface 36 if it longitudinally lies generally between the outer annular surface 36 and the midpoint 32. In an exemplary embodiment, the first resistive deflection coil 18 at least partially longitudinally-overlaps the first end wall 20. Thus, in this exemplary embodiment, at least a portion of the first resistive deflection coil 18 is positioned generally longitudinally between the outer annular surface 36 and the inner annular surface 38 of the first end wall 20. The first resistive deflection coil 18 carries an electric current generally in an opposite direction to the first direction. Preferably, the first resistive deflection coil 18 has a number of ampere turns which is less than generally one-tenth the number of ampere turns of the at least one main superconductive coil 28. In a preferred embodiment, the first resistive deflection coil 18 consists essentially of copper.

In a closed-magnet design, as seen in FIG. 1, the magnet 10 would further include a second resistive deflection coil 40 generally coaxially aligned with the axis 12, disposed outside the housing 14 radially proximate the outer cylindrical wall 24 and longitudinally closer to the second end wall 22 than to the midpoint 32, and carrying an electric current generally in the opposite direction (i.e., opposite to that of the at least one main superconductive coil 28). It is noted that the direction of the electric current in the first and second resistive deflection coils 18 and 40 is generally identical. The second resistive deflection coil 40 has a number of ampere turns which is generally equal to the number of ampere turns of the first resistive deflection coil 18. In a preferred closed-magnet design, the first and second resistive deflection coils 18 and 40 are generally identical to each other and are disposed in mirror-image fashion about a plane which is perpendicular to the axis 12 and which passes through the midpoint 32.

In operation, the stray magnetic field of the at least one main superconductive coil 28, which is not captured by the magnetizable first end wall 20, exits the bore 34 to pass radially outward past the first end wall 20. The first resistive deflection coil 18 is disposed to have its magnetic field deflect such exiting stray magnetic field longitudinally inward to be captured by the magnetizable first end wall 20. The exiting stray magnetic field is said to be deflected because the magnetic field vector of the first resistive deflection coil 18 is added to it. To keep the stray magnetic field within the magnetizable outer cylindrical wall 24 in the vicinity of the second end wall 22, the second resistive deflection coil 40 is disposed to counteract the undesirable "spill-over" influence of the main superconductive coil(s) located near the second end wall 22.

Applicants have designed (but have yet to build) two magnets similar to the magnet 10 seen in FIG. 1. Applicants designed the magnets using the principles of the present invention, previously disclosed herein, together with conventional magnetic field analysis, as is within the skill of the artisan. For a 1.0 Tesla magnet and a desired level of magnetic shielding, the housing 14 used 15,000 pounds of iron and was 1.7 meters long without the resistive deflection coils 18 and 40 of the invention, but used 10,000 pounds of iron and was 1.6 meters long with individual 5,700 ampere-turn resistive deflection coils 18 and 40 of the invention. For a 1.5 Tesla magnet and a desired level of magnetic shielding, the housing 14 used 18,000 pounds of iron and was over 2.0 meters long without the resistive deflection coils 18 and 40 of the invention, but used 16,000 pounds of iron and was 1.9 meters long with individual 5,000 ampere-turn resistive deflection coils 18 and 40 of the invention. It is noted that the at least one main superconductive coil 28 has its total number of ampere turns increased by less than 5% due to the presence of the resistive deflection coils 18 and 40. It is further noted that if superconductive shielding coils were used in place of the iron, the at least one main superconductive coil 28 would have to increase its number of ampere turns by about 50% and the number of ampere turns of the superconductive shielding coils would be about half that of the main superconductive coils.

Figure 2:
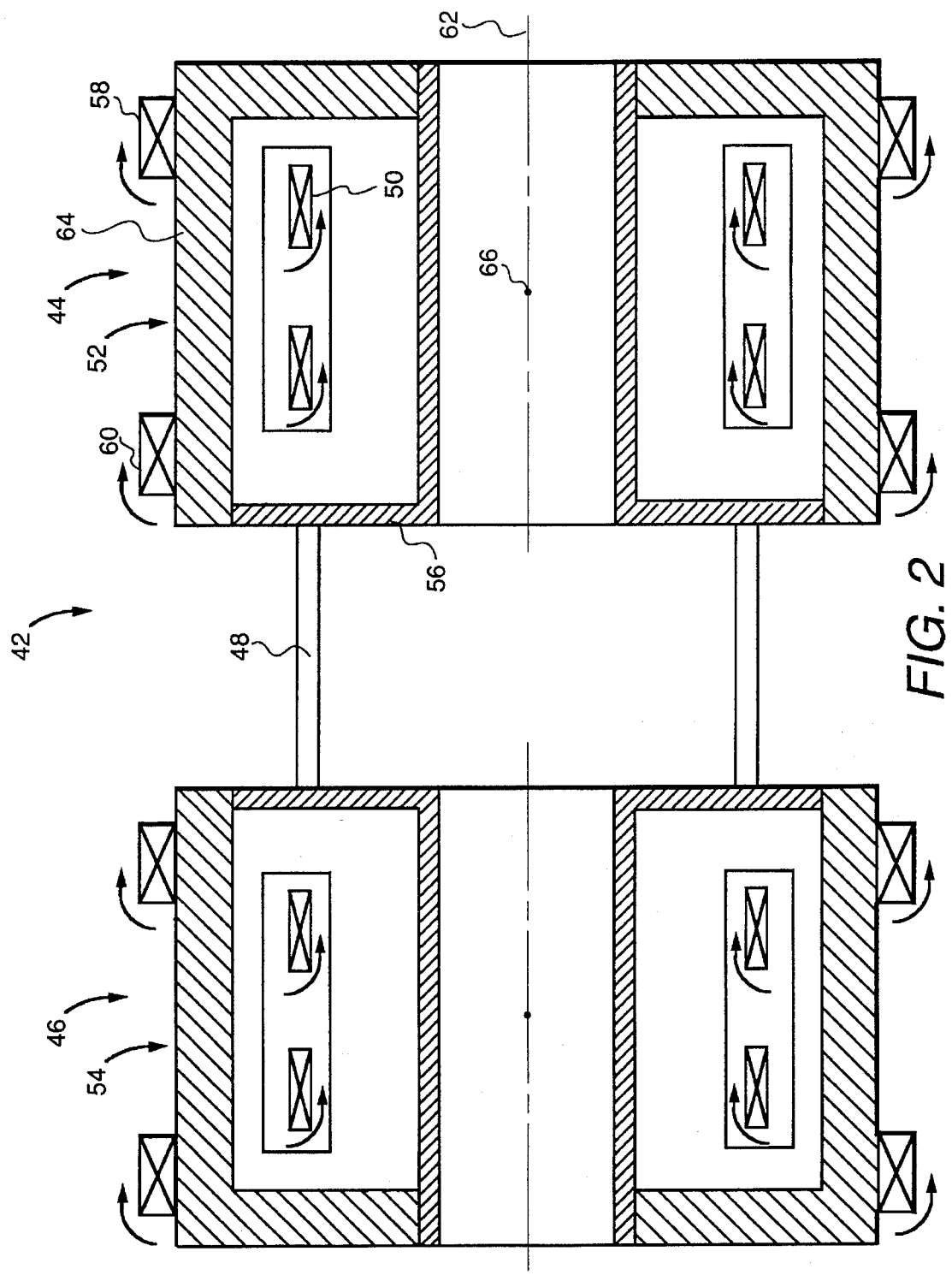
FIG. 2 is a schematic cross-sectional side-elevational view of an open superconductive magnet of the present invention.

Referring again to the drawings, FIG. 2 shows a second preferred embodiment of the superconductive magnet 42 of the present invention. Magnet 42 is an open magnet having two magnet assemblies 44 and 46 longitudinally spaced-apart by generally parallel structural posts 48 to create an intervening open space. Magnet assembly 46 is a generally mirror image of magnet assembly 44 about a plane oriented generally perpendicular to the structural posts 48 and disposed generally equidistant from the magnet assemblies 44 and 46. Magnet assembly 44 is generally identical to magnet 10 of FIG. 1 with differences as hereinafter noted. The at least one main superconductive coil 50 of magnet assembly 44 has two (instead of six) such coils. The housing 52 of magnet assembly 44 is an open-magnet (instead of a closed-magnet) housing. It is noted that when the housings are vacuum enclosures, housing 52 of magnet assembly 44 preferably is hermetically connected to housing 54 of magnet assembly 46 through the structural posts 48 (such detailed design being omitted from the drawings for clarity). The second (i.e., longitudinally inward facing) end wall 56 of the housing 52 of magnet assembly 44 is a generally non-magnetizable (instead of a magnetizable) wall. It is also noted that the first and second resistive deflection coils 58 and 60 each have a number of ampere turns and that the second resistive deflection coil 60 is generally coaxially aligned with the axis 62, is disposed outside the housing 52 radially proximate the outer cylindrical wall 64 closer to the second (i.e., longitudinally inward facing) end wall 56 than to the midpoint 66, and carries an electric current generally in the opposite direction (i.e., opposite to the direction of electric current in the at least one main superconductive coil 50). The number of ampere turns of the second resistive deflection coil 60 is greater than (and not generally equal to) the number of ampere turns of the first resistive deflection coil 58, as can be appreciated by those skilled in the art. Finally, the MRI imaging volume (not shown) would lie in the open space between the two magnet assemblies 44 and 46 (and not within a magnet assembly 44 or 46).

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. A superconductive magnet comprising:

a) a generally longitudinally extending axis;

b) a generally annularly-cylindrical-shaped housing generally coaxially aligned with said axis, having annular, longitudinally-spaced-apart first and second end walls, and having radially-spaced-apart outer and inner cylindrical walls, wherein said first end wall and said outer cylindrical wall are generally magnetizable walls, and wherein said inner cylindrical wall is a generally non-magnetizable wall;

c) a superconductive coil assembly having at least one generally solenoidal-shaped main superconductive coil which is generally coaxially aligned with said axis, which is disposed within and generally spaced apart from said housing, which has a number of ampere turns, and which carries an electric current generally in a first direction; and d) a first resistive deflection coil generally coaxially aligned with said axis, disposed outside said housing radially proximate said outer cylindrical wall and longitudinally closer to said first end wall than to a midpoint located on said axis longitudinally halfway between said end walls, and carrying an electric current generally in an opposite direction to said first direction, wherein said housing is an open-magnet housing and wherein said second end wall is a generally non-magnetizable wall, and wherein each of said first and second end walls are connected to each of said inner and outer cylindrical walls to define said annularly-cylindrical shape of said housing.

2. The magnet of claim 1, also including a second resistive deflection coil generally coaxially aligned with said axis, disposed outside said housing radially proximate said outer cylindrical wall and longitudinally closer to said second end wall than to said midpoint, and carrying an electric current generally in said opposite direction.

3. The magnet of claim 2, wherein said first and second resistive deflection coils each have a number of ampere turns and wherein said number of ampere turns of said second resistive deflection coil is greater than said number of ampere turns of said first resistive deflection coil.

4. The magnet of claim 2, wherein said first and second end walls and said inner and outer cylindrical walls are hermetically connected together to define a vacuum enclosure.

\* \* \* \* \*